United States Patent [19]
Droz

[11] Patent Number: 6,161,276
[45] Date of Patent: Dec. 19, 2000

[54] METHOD FOR PRODUCING A TRANSPONDER COIL

[75] Inventor: François Droz, La Chaux-de-Fonds, Switzerland

[73] Assignee: NagraID S.A., La Chaux-de-Fonds, Switzerland

[21] Appl. No.: 09/230,707

[22] PCT Filed: Jun. 2, 1998

[86] PCT No.: PCT/CH98/00231

§ 371 Date: Oct. 25, 1999

§ 102(e) Date: Oct. 25, 1999

[87] PCT Pub. No.: WO98/56019

PCT Pub. Date: Dec. 10, 1998

[30] Foreign Application Priority Data

Jun. 3, 1997 [CH] Switzerland ............................ 1319/97
Jun. 10, 1997 [CH] Switzerland ............................ 1319/97

[51] Int. Cl.[7] ................................................... H01F 41/04
[52] U.S. Cl. ........................... 29/602.1; 29/849; 336/200; 342/51
[58] Field of Search .................................. 29/602.1, 846, 29/849; 342/51; 336/200

[56] References Cited

U.S. PATENT DOCUMENTS 2,622,054 12/1952 Franklin .
4,023,998 5/1977 Cederberg et al. .
5,184,111 2/1993 Pichl .

FOREIGN PATENT DOCUMENTS 1690542 11/1971 Germany .
4410732 10/1995 Germany .

Primary Examiner—Carl E. Hall
Attorney, Agent, or Firm—Clifford W. Browing; Woodard, Emhardt, Naughton, Moriarty & McNett

[57] ABSTRACT

A method of producing a transponder (20) comprising the following steps: demarcating the various turns (8) of a coil in a sheet (1), including a dielectric substrate covered by at least one conducting layer (2), by stamping said conducting layer with a stamping die (5) having sharp-edged surfaces (6) for contact with the superficial conducting layer (2; 2'''), connecting at least one electronic component (25) to the turns (8), and mounting at least one protective sheet (22; 27) covering the coil and the electronic component (25). To facilitate the stamping and to obtain clean incisions, the conducting layer is covered, before stamping, with a synthetic film. To prevent short circuits over the incisions, the incisions are preferably filled in with an adhesive, varnish or lacquer.

25 Claims, 3 Drawing Sheets

METHOD FOR PRODUCING A TRANSPONDER COIL

TECHNICAL FIELD

The present invention relates to a method for producing transponder coils and to a transponder comprising a coil produced according to this method. More specifically, the present invention relates to a method of producing coils for transponders, for example for chip cards.

PRIOR ART

In the technology of transponders, and in particular of chip cards of the transponder type, it is often desired to connect an induction coil to an electronic circuit, such as, for example, an integrated circuit mounted on a printed circuit board. Such a configuration is described, for example, in WO-91/19302. The coil is generally produced by winding a wire around a core. Such coils are complex to make, and therefore relatively costly. Moreover the connection between the printed circuit and the coil gives rise to certain additional problems relating to mounting and poses problems of reliability, in particular when these elements are integrated in a chip card not offering adequate protection against deformation and mechanical stresses. Furthermore the thickness of the coil makes it difficult to integrate the coil into a chip card of standard 0.76 mm thickness.

Coils are also known in which the turns of the coil are formed directly by the conducting tracks of a printed circuit, thus making it possible to avoid any soldering. The tracks of the printed circuit are generally produced by photo-chemical means, which entails numerous costly operations and the use of polluting products.

U.S. Pat. No. 4,555,291 describes an essentially mechanical method of producing a coil. A fine metallic film is cut beforehand in the shape of a spiral. In order to make the cut spiral rigid, the various turns are not completely separated. The spiral is then fixed on a sheet of dielectric material, and a second cutting device is set in operation to remove the interconnections between turns to produce a circuit of inductive nature.

This solution is complex to apply and entails, in particular, two distinct cutting operations. The thickness of the pre-cut metallic film must be sufficient to allow it to be transported without becoming deformed or torn; the width of the turns and of the gaps which have been cut between the turns must likewise be sufficient to provide the film with a minimum of rigidity prior to stratification on the dielectric substrate.

Other methods of producing coils starting from a synthetic film covered with a superficial conducting layer are known, and in these methods the various turns are demarcated by mechanical stamping of the said conducting layer carried out by means of a stamping die. U.S. Pat. No. 2,622,054, EP 0 096 516 or GB 610 058, for example, describe variants of such a method. It is difficult to obtain tracks of very narrow width with these stamping techniques. Moreover, the synthetic film must have a sufficient thickness to withstand the stamping pressure and remain sufficiently rigid even in the regions stamped by the stamping die.

DE 2 758 204 describes a method of producing a printed circuit, in particular an inductance circuit, in which the various tracks that form the turns of the coil are demarcated by thermo-mechanical machining of a synthetic film covered with a superficial metallic layer. A heated metallic spike (3) passes through the superficial metallic layer and simultaneously causes part of the synthetic layer to melt beneath the metal.

The method described in the DE 2 758 204 document is more specifically suited to the production of various kinds of devices or to coils whose thickness is not crucial. The thickness of the synthetic layer (1) must be sufficiently thick to be indented by the metallic spike (3) and at the same time be heated without being passed through completely. Control of the temperature of the spike (3) poses additional difficulties; moreover, the metallic spike (3) must be moved slowly enough for the synthetic material to have time to melt. This method is thus unsuitable for producing coils which must, for example, be integrated into chip cards and whose thickness as well as cost and production time must be minimized.

Patent Application WO98/04105, the content of which is incorporated herein by reference, describes a method of producing a transponder, in particular a chip card, comprising a coil made by stamping a sheet comprising a conducting layer, without pushing material in depthwise, or removing any conducting material. The stamping die has sharp-edged surfaces for contact with the conducting layer. This method allows extremely thin coils, capable of being inserted, for example, in chip cards, to be obtained very economically. The width of the incisions is small enough that a high number of turns can be obtained on an area as small as that of a transponder or a chip card.

SUMMARY OF THE INVENTION

An object of the present invention is thus to propose an improvement to the method of producing a coil described in the aforementioned application WO98/04105, in particular a method allowing the turns density of the coil on a transponder to be increased further and/or the thickness of the coil to be decreased.

DESCRIPTION OF THE INVENTION

According to one aspect of the invention, this object is attained by means of a method for making a printed circuit such as is a method of producing a coil for a transponder (20) comprising the following steps: demarcating the various turns (8) of a coil in a sheet (1, 2, 3, 4) including at least one conducting layer (2) by stamping the said conducting layer using a stamping die to cut incisions (7), separating the said turns, connecting at least one electronic component (25) with the said turns (8), covering the said conducting layer (2) before stamping with a superficial film (3) intended to make stamping easier, and inserting at least one insulating material (9, 220) in the said incisions (7) to guarantee electrical isolation of the various conducting tracks (8).

The invention comes from the observation that, in the device described in the application WO98/04105, it is difficult to obtain a clean and precise cutting of incisions delimiting the turns of a coil. The difficulty stems from the ductility of metals used for the conducting layer. The stamping die, as it is lowered, tends to sink into and deform the conducting layer without immediately cutting it. When the pressure is sufficient, the conducting layer tears suddenly under the die. The edges at the rim of the incision stamped using this method are not very clean and sometimes have burrs; fine and relatively shallow incisions are consequently difficult to stamp, especially when the stamping die is not perfectly sharpened. To reduce the risk of short circuit between the turns on each side of the incision, it is necessary to replace the die frequently and to stamp incisions of relatively large width, for example by lowering the die further, which goes against the objective of maximizing the turns density and of limiting the thickness of the coil.

Moreover it is difficult to laminate a protective layer onto the chip card, which generally consists of PVC, on top of the conducting layer, which generally consists of aluminum. The problem is particularly critical when the sheet of aluminum for the conducting layer is not absolutely flat.

According to the invention, these difficulties are eliminated by first covering the conducting layer that is to be stamped with a superficial film, for example with a synthetic film.

Tests have shown that this superficial film can make the stamping of incisions considerably easier, and allows much cleaner edges to be obtained at the rim of incisions with an equivalent depth of penetration, using an identical die.

By furthermore inserting an insulating material in the stamped incisions, for example a coating, adhesive, or the material of a laminated top layer, it is also possible to guarantee optimal insulation between adjacent turns.

This method thus allows the mentioned drawbacks of the prior art to be avoided.

BRIEF DESCRIPTION OF THE DRAWINGS

Other aspects and advantages of the invention will emerge from the description, given by way of example and illustrated by the attached figures which show.

DETAILED DESCRIPTION OF THE PREFERRED EMBODIMENT

Figure 1:
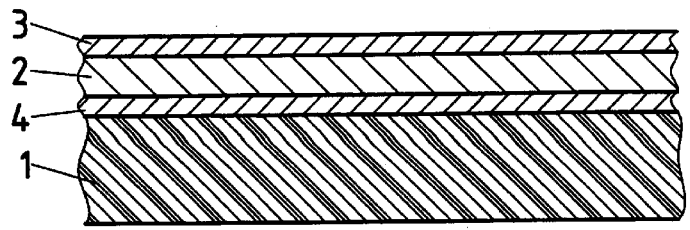
FIGS. 1 to 6, a sectioned view of a portion of coil during six successive stages of manufacture.

FIG. 1 shows a sectioned view of a sheet 1, 4, 2. The sheet 1, 4, 2 preferably consists of any dielectric substrate 1, for example a synthetic material of the PVC type or of cardboard, covered with a superficial conducting layer 2. Depending upon the application, a flexible film, or, on the contrary, a more rigid substrate will be chosen. The substrate 1 may thus consist of a composite or multi-layered material, for example a laminate comprising a number of layers of material, or include local reinforcements, for example of epoxy, fiberglass, carbon fiber, etc., for example in the region intended to receive the electronic component.

The superficial conducting layer 2 is applied to the layer 1 using a known method and is held in place, for example, by soldering or by means of adhesive 4. The adhesive 4 can, for example be a hot-setting adhesive, a cold-setting adhesive or an adhesive that is hardened by exposure to UV; it is also possible to use as an adhesive 4 a double-sided adhesive sheet or a thermo-adhesive film. The layer 2 is made of an appropriate metal, for example copper, aluminum, silver or a conducting alloy, or by means of a conducting ink.

Optionally, the dielectric substrate 1 can be provided with through-holes which will be filled in by the metal of the layer 2 upon pressure lamination. Points of electrical contact on the lower face of the sheet 1, 4, 2 can thus be produced economically. In an alternative form, the holes may be metallized by means of an added insert.

According to the invention, the upper face (the face away from the substrate) of the conducting layer 2 is covered beforehand, at least partially, with a film 3, for example with a film of synthetic material. Metallic sheets, for example sheets of aluminum, covered with a thin, synthetic protective layer, are widely available commercially. The function of this film 3, as will be seen, is mainly to facilitate the stamping of the incisions, demarcating the tracks, and to improve the quality of the incisions obtained. It is also possible to deposit the film 3 on the conducting layer 2 after the layer 2 and the substrate 1 have been laminated, for example just before stamping.

Figure 2:
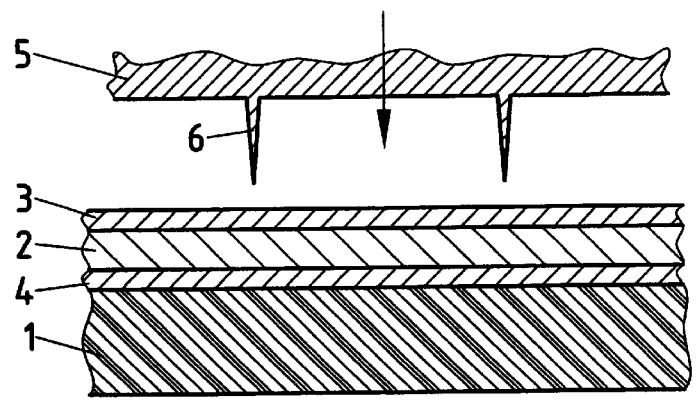

FIG. 2 shows a sectioned view of a stamping die 5 above the portion of sheet 1, 2, 3, 4, before demarcation of the conducting tracks. The stamping die 5 has sharp-edged surfaces 6 for contact with the superficial layer 3.

The stamping die 5 is lowered, by means not shown, with a pressure just sufficient so that the sharp-edged contact surfaces 6 perforate and cut the superficial metallic layer 2. Mechanical stops can also be used to control the lowering. The profile of the surfaces 6 is sufficiently sharpened that the die cuts fine incisions 7 in the layer 2 without removing conducting material as is the case in the methods of milling and without pushing material in, depthwise, as is the case in the stamping methods of the type disclosed in GB 1 138 628. Here, the metallic material is incised by the surfaces 6.

Figure 3:
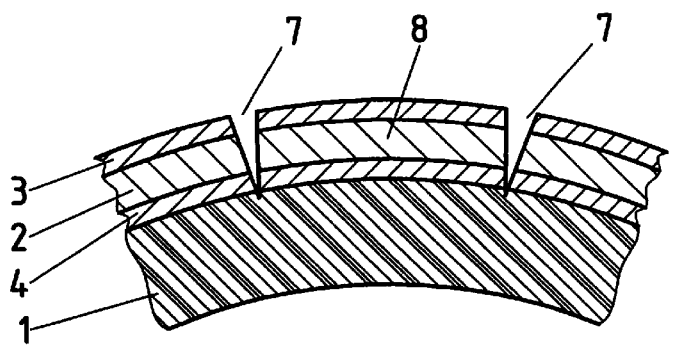

FIG. 3 shows a sectioned view of the portion of sheet 1, 2, 3, 4 covered with a metallic layer 2 after demarcation of the conducting tracks 8. It can be seen that the incisions 7 are just deep enough to pass through the film 3, the metallic layer 2, the layer of adhesive 4 and possibly graze the synthetic dielectric layer 1. In a variant, the incisions 7 completely pass through the film 3 and the superficial metallic layer only, with the bottom of the incisions being in the middle of the layer of adhesive 4. In this way the synthetic film 1 is weakened as little as necessary by the machining of the demarcations between conducting tracks 8, and can have a minimal thickness.

In an unillustrated embodiment of the invention, the film 3 intended to facilitate the machining of clean incisions is removed after the stamping operation in order to reduce the thickness of the card as much as possible. To this end, the film 3 is not necessarily glued on the metallic layer 2, or at least is not glued by means of a permanent adhesive.

The stamping causes a lateral pushing of material into the incisions 7. This pushing of material causes a bowing of the sheet 1, 2, 3, 4, greatly exaggerated in FIG. 3, so that the incisions 7 gape widely.

To optimize the density of conducting tracks 8 on the printed circuit, the width of the incisions 7 is as fine as possible. The superficial layer 3 allows a very clear cutting of incisions to be obtained, so that the risk of short circuit between conducting tracks 8, caused by burrs from cutting, is greatly reduced.

The stamping die has a spiral-shaped cutting surface 6 and cuts an inductive element (coil) in the conducting layer 2, the turns of which coil are formed by the conducting tracks of the printed circuit. Conventional additional machining operations, for example, drilling and soldering, can then be carried out in order to fix discrete components onto the printed circuit thus produced.

During the next manufacturing step, which is not illustrated here, certain pre-cut regions of the conducting layer 2 are preferably unstuck and removed in such a way as to preserve only the useful portions of the conducting layer 2. The unstuck regions can include, for example, the metallic region A (FIGS. 7 and 8) inside the coil between the turns, the region C on the exterior of the coil, or a segment of the said turns. By doing away with the portions A and C on the inside or outside, respectively, of the turns, these portions of poorly controlled shape can be kept from disturbing the magnetic field lines of the coil and from thus altering the characteristics of the coil in a way difficult to predict. By unsticking a portion B of the turns, the inductance of the coil, for example, can be adjusted. It is also possible to adjust the inductance of the coil by machining the turns after stamping. To facilitate the unsticking, a non-permanent adhesive 4 is preferably used between the conducting layer 2 and the substrate 1, permitting easy unsticking by peeling off of the desired portions A, B, C. In another embodiment, it is also possible to spread adhesive beforehand on only those portions of the metallic layer 2 which are intended to be kept on the substrate 1, and leave unglued the residual portions which are intended to be removed.

The dielectric layer, for example of PVC, becomes visible in the portions of the card A, B, C, where the metallic layer 2 has been unstuck, with the two associated layers 3 and/or 4. The lamination (described further on) of a protective layer 22 on top of the card is thus greatly facilitated since the protective layer is generally chosen to be of the same dielectric material as the layer 1. In particular, if the portion C of the conducting layer is unstuck, the adhesion of layers 1 and 22 is ensured on the edges of the card.

Figure 4:
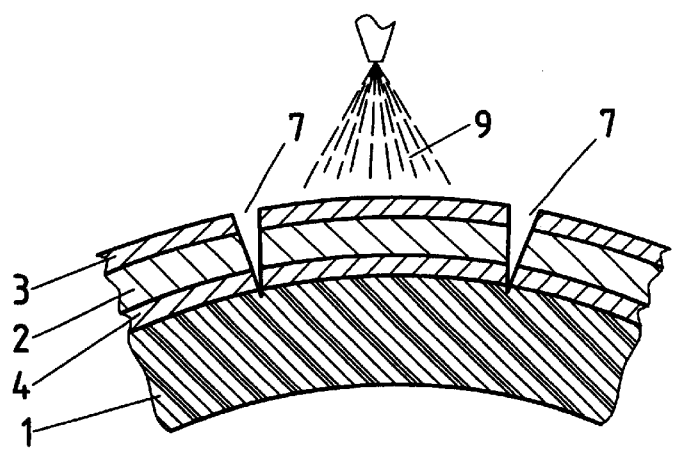

After the cutting of incisions 7, the method according to the invention preferably includes a step of inserting insulating material in the incisions 7 in order to prevent the incisions from closing up again upon deformations of the card. In FIG. 4, the incisions are filled with a coating, for example a varnish, a lacquer, a resin or a preimpregnated material 9, for example, atomized by spraying on the surface of the sheet 1, 2, 3, 4, glued on, or applied by serigraphy. The incisions could also be filled and insulated, however, with any insulating material. For example, the surface of the sheet 1, 2, 3, 4, could be coated with a cold-setting or hot-setting adhesive sufficiently fluid to also penetrate to the bottom of the incisions 7, and allowing an upper layer of protection to be stuck on the surface of the cut coil. On account of the maximal spacing of incisions, due to the bowing of the sheet, the chosen material 9 easily penetrates to the bottom of the incisions 7. The material 9 allows the irregularities in height of the cut sheet 1, 2, 3, 4, to be amply compensated for. It is also possible for the incisions 9 to be partially filled with the material of the top layer laminated subsequently, as described below.

When the risk of short circuit between neighbouring turns is high, for example in the case of a flexible substrate, it is possible to remove (for example by unsticking) a portion of the conducting layer between the turns. In this case, it is necessary to cut two incisions between the turns that are to be isolated and to unstick the metal between these two incisions.

The next manufacturing step, which is optional and is not illustrated here, consists in straightening out the sheet 1, 2, 3, 4, by compressing it between two plates, possibly at high temperature, in such a way as to compensate for the bowing.

In a first embodiment, the pressure applied during this operation of correction of the bowing is sufficient to press down the non-unstuck portions of the conducting layer 2, 3, 4 into the thickness of the dielectric 1. It is possible to push down the layer 2 until it becomes flush with the upper surface of the dielectric layer 1, thus improving substantially the flatness of the layered arrangement.

In a second embodiment, the difference in height resulting from the unsticking of portions A, B and/or C of the conducting layer 2 is compensated for by laminating over the dielectric layer 1 an intermediate dielectric sheet, not depicted, which has substantially the thickness of the layers 2, 3, 9, and whose shape corresponds to that of the unstuck portions A, B, C.

In a third embodiment, this difference in height is compensated for beforehand by laminating over the dielectric 1, even before the application of the layer 2, 3, a dielectric sheet, not depicted, which was substantially the thickness of the layers 2, 3, 9, and whose shape corresponds to that of the portions without tracks A, B, C. In this case, the conducting layer 2, 3, is cut to the desired shape even before it is laminated on the layer 1.

The next manufacturing step, which is not illustrated here, involves mounting at least one electric or electronic component on the sheet 1, 2, 3, 4. This component can be fixed on the sheet by any means, for example by gluing or by bonding. In another embodiment, discussed in more detail further below, the component is simply placed at the appropriate place on the sheet and will be held in place only by the upper protective layer. Depending upon the thickness of the component, it could be necessary to provide a recess in the sheet 1, 2, 3, 4 to accommodate the component without creating a bulge at the surface of the card. The accommodation may, for example, be machined in one or more layers of the sheet 1, 2, 3, 4, for example by stamping, before, during or after the lamination of these layers. It is also possible to machine this recess by means of the stamping die 5, which in this case has one or more portions allowing the material of the sheet 1, 2, 3, 4 to be pressed in or pushed back depthwise in the region intended to accommodate the component or in any region likely to have an excessive thickness, for example in the region of the bridge between the coil and the electric component. The region of the recess may be pushed in locally; it is also possible for this recess to be filled with a material that coats the electronic component and holds it in place.

Figure 5:
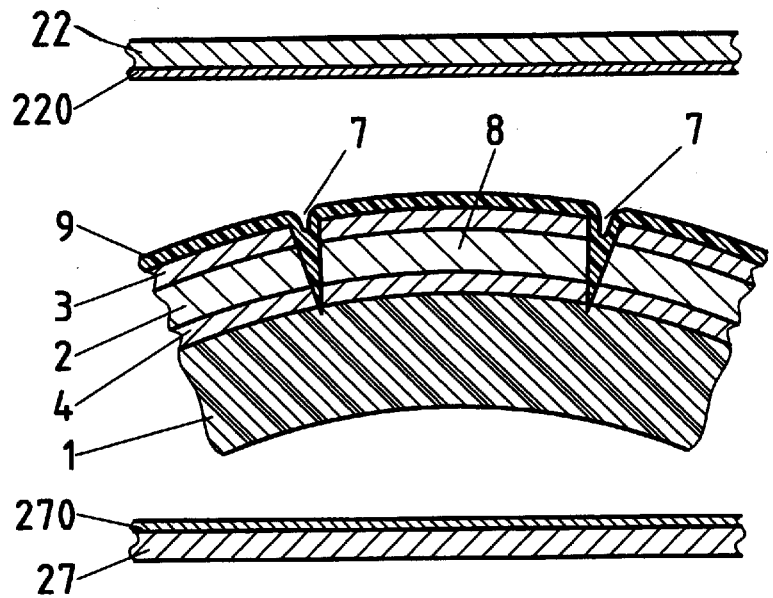

FIG. 5 illustrates the next step in the manufacture of the transponder according to the invention. During this step, the sheet 1, 2, 3, 4 of the invention, covered with the layer 9 at least partially filling in the incisions 7, is laminated between (at least) one upper protective sheet 22 and (at least) one lower protective sheet 27. Each protective sheet is mounted preferably under pressure, for example by means of a layer of adhesive 220, and respectively 270. The layer of adhesive 220 allowing mounting of the upper protective sheet 22 is preferably thick and fluid enough to compensate for irregularities in the thickness at the surface of the card, in particular in the area of the coil and of the electronic component or components, and to fill in the residual interstice in the incisions 7. The protective sheets 22, 27 can also be laminated by hot pressing without the layer of adhesive 220, 270. In this case, the molten material of the sheets also contributes towards compensating for the irregularities in thickness and towards filling in the incisions 7. Moreover, in a known way, windows, for example for electrical contacts, and recesses to accommodate the components in the card can be provided in the sheet 22 and/or 27. The external face of the sheets 22 and 27 is smooth enough to allow the finished card to be printed in cases where the sheets 22, 27 have not been printed beforehand.

In another embodiment of the invention, the lower protective sheet 27 is omitted. In this case, the lower external surface of the card consists directly of the surface of the dielectric layer 1 which must have adequate surface qualities that will allow printing and, if need be, reliable functioning in the automatic machines.

In another embodiment, the chip card is made by placing the sheet 1, 2, 3, 4 in a mold and by injecting material around this sheet (overmolding). For this embodiment it can be advantageous to laminate an additional dielectric sheet 1 over the assembly 1, 2, 3, 4 in such a way as to overmold a sheet as symmetric as possible. In any case, the compensation for the bowing of the sheet is less crucial in this embodiment.

Figure 6:
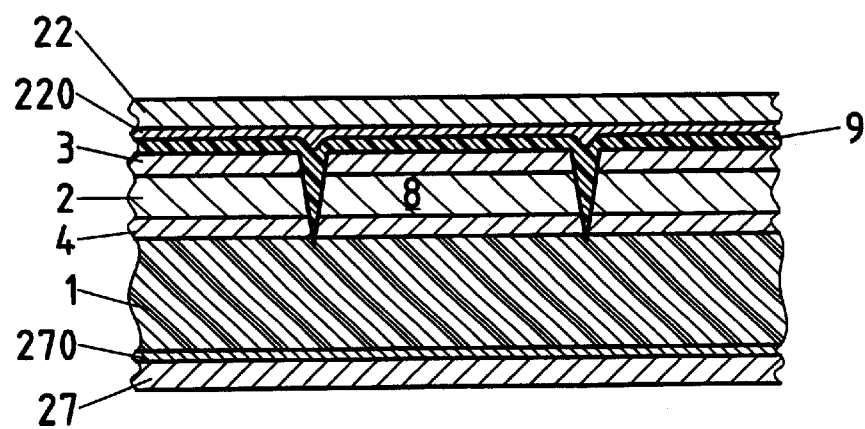

FIG. 6 shows a section through a portion of the finished card. It can be noted that under the combined effect of the pressure applied upon lamination of the protective sheets 22, 27 and of the rigidity of these sheets, bowing of the card is avoided, which means that the method allows absolutely flat cards to be obtained. The mentioned step of straightening out the sheet by compression before the lamination of the sheets 22, 27 is not generally necessary in cases where the sheets 22, 27 undergo cold lamination.

It will be noted that in the portions A, 8, C without conducting tracks 2, 3, 4, 9, the layer 220 can be laminated directly on the dielectric layer 1, or, where appropriate, on the aformentioned height-compensation layer. Optimal adherence is thus ensured.

Several chip cards are preferably made from a single sheet 1, 2, 3, 4. It is possible, for example, to distribute a large number of coils, disposed in a matrix, on a single sheet of sufficient size or on a continuous strip. The various coils on the sheet can either be machined simultaneously, by means of a single stamping die of large size, or successively by means of the same die moved between each cut (stepper). In both cases, an operation, not depicted, of splitting up the sheet and of cutting out the individual cards is necessary after lamination of the various layers.

Figure 7:
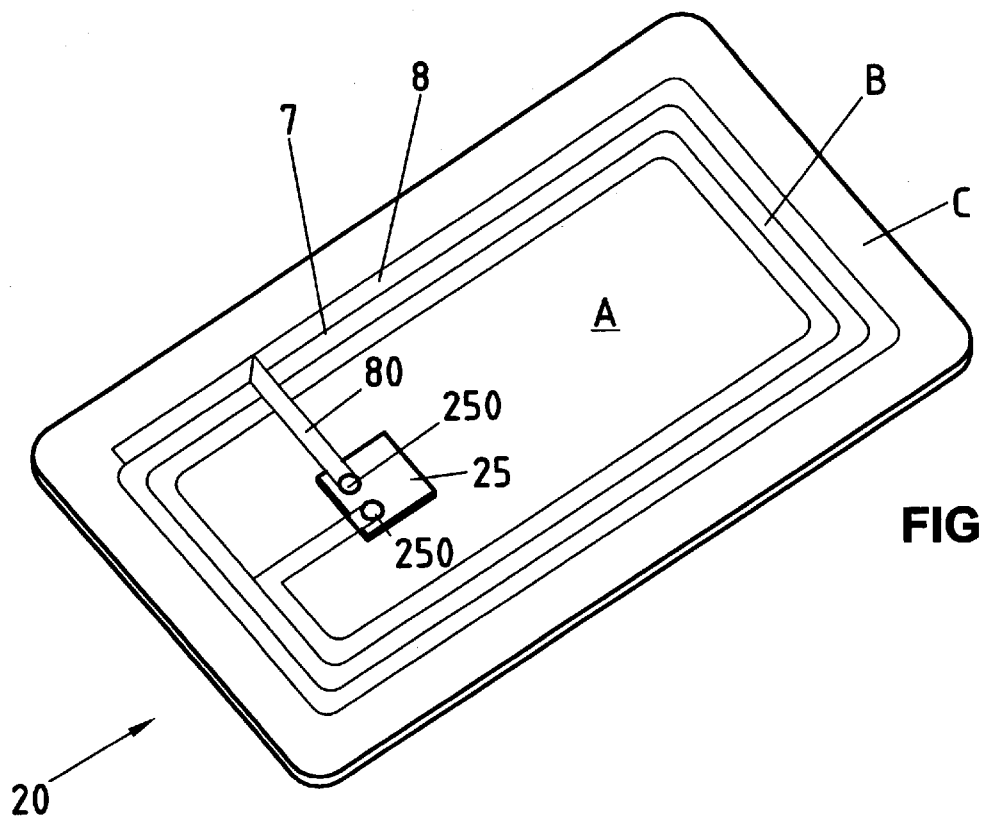
FIG. 7, a perspective view of a chip card including a printed circuit according to a first embodiment of the connection between the coil and an electronic component, both depicted in transparence.
Figure 8:
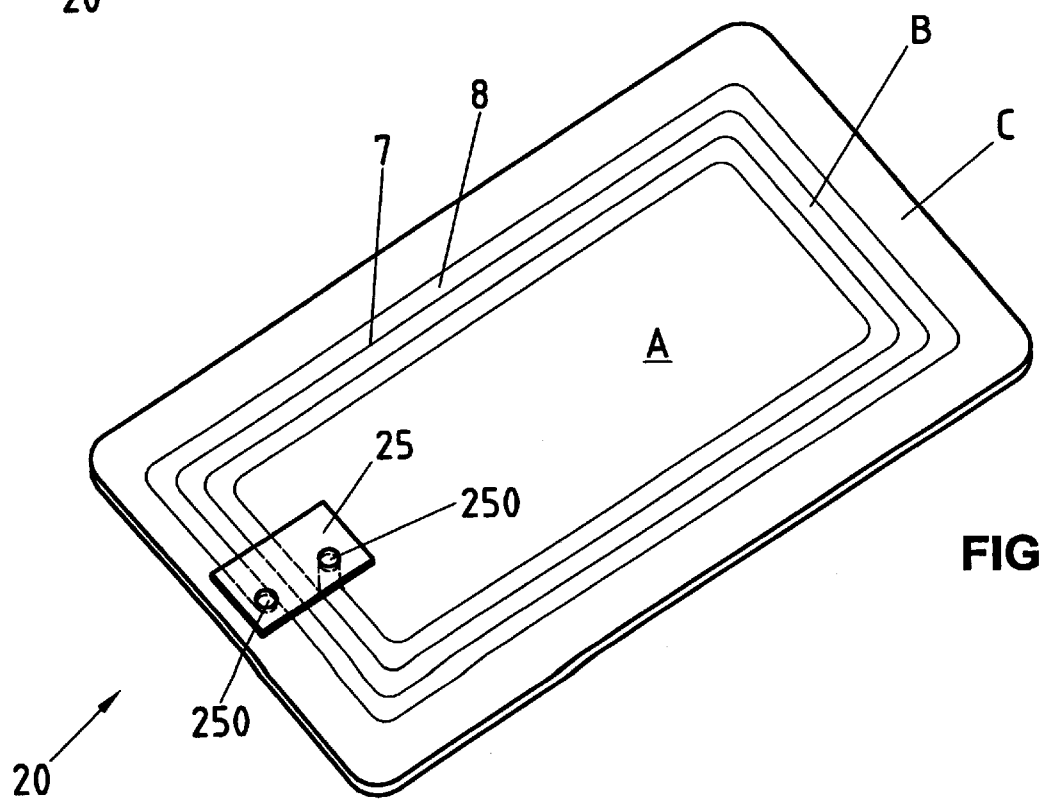
FIG. 8, a perspective view of a chip card including a printed circuit according to a second embodiment of the connection between the coil and an electronic component, both depicted in transparence.

Above we discussed only briefly the connection of the electronic component or components with the turns 8 of the coil thus machined. FIGS. 7 and 8 illustrate two embodiments of this connection, in cases where the transponder consists of a chip card having an integrated circuit and a coil 8.

The integrated circuit 25, which can be accommodated in a recess, not depicted, in one or more layers of the card, is connected to the two ends of the inductive element 8. The connection between the circuit 25 and the internal turn of the coil can be made directly in the case, shown in FIG. 7, where the circuit 25 is disposed between the turns of the coil. The connection with the external turn of the coil 8 must be made, however, by way of a bridge 80 over the turns 8. The bridge could, for example, consist of a simple soldered wire over or under the conducting tracks 8. In the case of a circuit with several conducting layers, it is also possible to use one of the metallized layers to make the bridge, or to integrate the bridge into the substrate 1 before laminating the conducting layers 2.

In FIG. 7, the bridge has been made very simply by unsticking (after, if appropriate, the spraying of the insulating material 9) an appropriate length of the last turn of the coil and by bending this length back, folding it, if necessary, over the other turns, or possibly under the other turns by passing it through a through-hole provided for this purpose. The electrical insulation between the length 80 and the other turns is achieved solely by means of the sprayed layer 9 and/or by the layer 3. The end of the length 80 can be glued between the turns or simply held in place by the rigidity of the metallic material 2. A connection pin 250 of the component 25 is thus put in electrical contact with this portion 80, respectively with the internal turn of the coil. In a variant, it is also possible to bend back over the turns a portion of the conducting layer independent of the coil.

In FIG. 8, the integrated circuit 25 is mounted straddling the turns 8. This arrangement makes the bridge 80 superfluous; a connection pin 250 of the circuit 25 is connected electrically directly to the external turn of the coil 8 whereas another pin 250 is connected directly to the internal turn of this coil. This variant is especially simple to achieve, but limits the choice of circuits 25 which can be used and has the drawback of adding the thickness of the coil to that of the circuit 25 or of entailing the provision of a recess or a lowering of the turns at that spot.

The connection pins 250 can be glued, soldered or fixed by bonding with the turns 8. It has been observed in conventional transponders, however, that such soldering sometimes breaks when the card is flexed or deformed a large number of times. To lessen this risk, in a preferred embodiment of the invention the connection pins 250 are simply disposed over the turns 8, without soldering or any particular fixing. The integrated circuit 25 is thus kept pressed against the tracks 8 by the protective layer 22. This arrangement allows the pins to slide slightly over the tracks 8 when the card is flexed and to return to their initial position when the card regains its shape. Owing to the elasticity of the upper protective layer 22, the pins 25 remain constantly pressed with a certain pressure against the contact portion of the turns 8, which enables a good quality electrical contact to be ensured even after the card has been flexed or deformed a number of times.

Of course it is important to ensure that the region of the tracks 8 that is intended to come into contact with the pins of the circuit 25 is not covered with insulating material 3 or 9. To this end, this region can, for example, be protected during the laminating film 2 or the spraying of material 9. It is also possible to remove these layers 3, 9 locally before mounting the circuit 25.

The person skilled in the art will note that this additional feature of the invention is independent of the manufacture of the coil and can be used for connecting any type of wound or machined coil to any type of electronic component.

Depending upon the desired application and the available space remaining on the card, components other than the integrated circuit 25 and the coil 8 can be integrated on the printed circuit 21. It is possible, for example, to place on the circuit an accumulator (not shown) which could be recharged from the outside by means of an inductive element, for example by means of the element 23. These other components would ideally be connected with each other and with the elements 8 and 25 by means of conducting tracks machined in the superficial conducting layer or layers 2 in the way described above.

The person skilled in the art will note here that, contrary to the majority of known prior art techniques, the manufacture of the conducting tracks 8 on the printed circuit using the method according to the invention creates remarkably few surface irregularities, which irregularities are, moreover, compensated for by the adhesive or upon fusion of the upper layers. It is thus relatively easy to mount the upper sheet 22 while obtaining an absolutely flat external surface.

Other methods of laminating chip cards can be used with coils according to the invention, for example the methods forming the subject matter of Patent Application WO94/22111, the text of which is incorporated herein by reference, or one of the prior-art methods mentioned in this application.

The method according to the invention can be extended to the production of transponders with double-sided and/or multi-layer circuits, that is having a plurality of layers of conducting material 2 which are superimposed and machined so as to define a plurality of levels of tracks. Besides chip card manufacture, the method can also be used to produce any type of transponder, for example for tagging objects or animals or for the surveillance of articles in a store. Depending upon the application, the shape and the characteristics of the coil could be quite different. In the case of a chip card for applications of the banking transaction or payment type, a chip card provided with a coil permitting communication with the outside at high frequency, preferably with a frequency of more than 50 kHz, for example 10 MHz, would be preferred.

What is claimed is:

1. A method of producing a coil for a transponder (20) comprising the following steps:

demarcating the various turns (8) of a coil in a sheet (1, 2, 3, 4) including at least one conducting layer (2) by stamping the said conducting layer using a stamping die to cut incisions (7), separating the said turns, connecting at least one electronic component (25) with the said turns (8), covering the said conducting layer (2) before stamping with a superficial film (3) intended to make stamping easier, and inserting at least one insulating material (9, 220) in the said incisions (7) to guarantee electrical isolation of the various conducting tracks (8).

2. Method according to claim 1, characterized in that the said sheet (1, 2, 3, 4) includes a dielectric substrate (1) covered with the said conducting layer (2) itself covered with the said superficial film (3).

3. Method according to claim 1, characterized in that the stamping die (5) has sharp-edged surfaces (6) for contact with the surface of the sheet (1, 2, 3, 4).

4. Method according to claim 1, characterized in that it further comprises a step of machining in the said sheet means to accommodate the said at least one electronic component (25).

5. Method according to claim 4, characterized in that it further comprises filling the said means to accommodate with a material that coats the said electronic component.

6. Method according to claim 2, characterized in that the said dielectric substrate includes local reinforcements in the region of the electronic component.

7. Method according to claim 2, characterized in that the said dielectric substrate (1) includes at least one through-hole to be filled with the material of the said conducting layer.

8. Method according to claim 1, characterized in that the said insulating material (9) comprises a coating applied to the said coil (8) after the stamping of the said incisions (7).

9. Method according to claim 1, characterized in that the said insulating material (220) comprises an adhesive for mounting a protective sheet (22), glued onto the said sheet after stamping.

10. Method according to claim 1, characterized in that the said sheet (1, 2, 3, 4) is bent so as to space apart the said incisions (7) upon insertion of the said material (9, 220).

11. Method according to claim 10, characterized in that it further comprises straightening the said sheet (1, 2, 3, 4) by compression.

12. Method according to claim 1, characterized in that it further comprises a step of bending over at least a portion (80) of the said conductive layer in such a way to create at least one electrical bridge (80) over the said turns.

13. Method according to claim 2, characterized in that it further comprises mounting the said conducting layer (2) on the said substrate by means of a non-permanent adhesive (4), and unsticking at least one portion (A, B, C) of the said conducting layer after the said step of stamping incisions.

14. Method according to claim 13, characterized in that the said at least one unstuck portion includes at least the portion (A) of the said conducting layer between the said turns of the coil.

15. Method according to claim 12, characterized in that the said at least one unstuck portion includes at least the portion (C) of the said conducting layer outside the said turns of the coil.

16. Method according to claim 12, characterized in that the said at least one unstuck portion includes at least a segment (80) of the said turns.

17. Method according to claim 16, characterized in that the inductance of the coil is adjusted after stamping.

18. Method according to claim 16, characterized in that it further comprises forming an electric bridge (80) with a segment (80) of the said turns (8) previously covered with an insulating layer that has been unstuck.

19. Method according to claim 2, characterized in that the said conducting layer is glued on the said dielectric substrate only in certain portions, so as to facilitate the subsequent unsticking of residual portions (A, B, C).

20. Method according to claim 2, characterized in that it further comprises a step of pressing the said conducting layer (2, 3, 4) into the thickness of the dielectric (1) to improve the flatness.

21. Method according to claim 12, characterized in that it further comprises a step of laminating an intermediate dielectric sheet having substantially the thickness of the said conducting layer (2, 3, 9) and whose shape corresponds to that of the portions (A, B, C) without tracks in order to improve the flatness.

22. Method according to claim 1, characterized in that it further comprises a step of mounting at least one electronic component (25) straddling the said turns of the coil.

23. Method according to claim 1, characterized in that it further comprises a step of positioning at least one of the said electronic components (25) directly, without soldering, on the contact portions of the turns of the coil (8).

24. Method of according to claim 1, further including the step of mounting at least one protective sheet (22, 27) covering the said coil and the said electronic component (25).

25. Method according to claim 24, characterized in that it further comprises a step of mounting a second protective sheet (27) on the opposite face to the one provided with the first protective sheet.

* * * * *

UNITED STATES PATENT AND TRADEMARK OFFICE
CERTIFICATE OF CORRECTION

PATENT NO. : 6,161,276
DATED : December 19, 2000
INVENTOR(S) : Francois Droz

It is certified that error appears in the above-identified patent and that said Letters Patent is hereby corrected as shown below:

<u>Column 7,</u>
Line 18, please change "A, 8, C" to -- A, B, C --.
Line 37, please insert the number -- 25 -- following "integrated circuit."

Signed and Sealed this

Thirteenth Day of November, 2001

Attest:

NICHOLAS P. GODICI
Attesting Officer    Acting Director of the United States Patent and Trademark Office